United States Patent
Chung et al.

(10) Patent No.: US 12,027,549 B2
(45) Date of Patent: Jul. 2, 2024

(54) IMAGE SENSOR

(71) Applicant: SAMSUNG ELECTRONICS CO., LTD., Suwon-si (KR)

(72) Inventors: Youngwoo Chung, Yongin-si (KR); Junemo Koo, Seoul (KR); Jinpyo Kim, Suwon-si (KR); Juneyoung Park, Gunpo-si (KR); Eungkyu Lee, Seoul (KR); Jeongrae Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 17/387,050

(22) Filed: Jul. 28, 2021

(65) Prior Publication Data
US 2022/0173146 A1  Jun. 2, 2022

(30) Foreign Application Priority Data
Nov. 27, 2020  (KR) ........................ 10-2020-0162920

(51) Int. Cl.
*H01L 27/146* (2006.01)

(52) U.S. Cl.
CPC .. *H01L 27/14623* (2013.01); *H01L 27/14621* (2013.01); *H01L 27/14627* (2013.01); *H01L 27/14636* (2013.01)

(58) Field of Classification Search
CPC ... H01L 2223/54453; H01L 2223/5446; H01L 2223/54466; H01L 2223/54473; H01L 2223/5448; H01L 2223/54486; H01L 2223/54426; H01L 23/54; H01L 23/544
See application file for complete search history.

(56) References Cited

U.S. PATENT DOCUMENTS

| 8,742,525 | B2 | 6/2014 | Ogita et al. |
| 9,041,140 | B2 | 5/2015 | JangJian et al. |
| 9,219,092 | B2 | 12/2015 | JangJiian et al. |
| 9,564,468 | B2 | 2/2017 | Chou et al. |
| 10,483,310 | B2 | 11/2019 | Cheng et al. |
| 10,497,729 | B2 | 12/2019 | Wu et al. |
| 2009/0001617 | A1 | 1/2009 | Chang et al. |

(Continued)

FOREIGN PATENT DOCUMENTS

| CN | 104167420 | * 11/2014 | ........... H01L 27/146 |
| JP | WO2021053932 | * 3/2021 | ........... H01L 27/146 |
| KR | 10-2008-0114318 A | 12/2008 | |

*Primary Examiner* — John A Bodnar
(74) *Attorney, Agent, or Firm* — Sughrue Mion, PLLC

(57) ABSTRACT

Provided is an image sensor including a substrate, in which a pixel area including a plurality of unit pixels, an optical black area located outside of the pixel area, and an alignment key area located outside of the pixel area are included, the substrate having a first surface and a second surface opposing the first surface, an interconnection structure below the first surface of the substrate, photoelectric conversion elements in the pixel area of the substrate, an insulating layer on the second surface of the substrate, a grid layer on the insulating layer in the pixel area and the alignment key area, a key pattern layer between the insulating layer disposed in the alignment key area and the grid layer disposed in the alignment key area, the key pattern layer including a protruding region to correspond to the grid layer, and color filters on the insulating layer and the grid layer in the pixel area.

20 Claims, 13 Drawing Sheets

(56) References Cited

U.S. PATENT DOCUMENTS

| | | | |
|---|---|---|---|
| 2011/0300662 A1* | 12/2011 | Watanabe | G03F 9/708 |
| | | | 438/70 |
| 2013/0323875 A1* | 12/2013 | Park | H01L 31/022408 |
| | | | 438/70 |
| 2015/0130007 A1 | 5/2015 | Kawamura | |
| 2019/0088704 A1 | 3/2019 | Jang et al. | |
| 2020/0119072 A1 | 4/2020 | Lim | |

* cited by examiner

IMAGE SENSOR

CROSS-REFERENCE TO THE RELATED APPLICATION

This application claims priority to Korean Patent Application No. 10-2020-0162920, filed on Nov. 27, 2020 in the Korean Intellectual Property Office, the entirety of which is incorporated herein by reference.

BACKGROUND

1. Field

Example embodiments of the present disclosure relate to an image sensor.

2. Background of Related Art

Image sensors are semiconductor devices converting optical images into electrical signals. Image sensors are not only used in consumer electronic devices such as digital cameras, mobile phone cameras, and portable camcorders, but also in cameras embedded in automobiles, security devices, and robots. These image sensors require miniaturization and high resolution, and various studies have been conducted to meet these requirements.

SUMMARY

One or more example embodiments provide an image sensor having improved reliability.

According to an aspect of an example embodiment, there is provided an image sensor including a first chip structure including a first substrate, a first interconnection structure disposed on the first substrate, and a first insulating layer disposed on the first substrate to at least partially cover the first interconnection structure, and a second chip structure disposed on the first chip structure, the second chip structure including a pixel area including a plurality of unit pixels, an optical black area disposed outside of the pixel area, and an alignment key area disposed outside of the pixel area, wherein the second chip structure further includes a second substrate having a first surface facing the first chip structure and a second surface opposite to the first surface, a second interconnection structure and a second insulating layer disposed between the first surface of the second substrate and the first chip structure, photoelectric conversion elements disposed in the second substrate disposed in the pixel area, a third insulating layer disposed on the second surface of the second substrate, a grid layer disposed on the third insulating layer disposed in the pixel area and the third insulating layer disposed in the alignment key area, a key pattern layer disposed between the third insulating layer disposed in the alignment key area and the grid layer disposed in the alignment key area, and color filters and microlenses disposed on the third insulating layer disposed in the pixel area and the grid layer disposed in the pixel area, wherein the key pattern layer includes a first region disposed on the third insulating layer, and a second region protruding from the first region to correspond to the grid layer.

According to another aspect of an example embodiment, there is provided an image sensor including a substrate, in which a pixel area including a plurality of unit pixels, an optical black area located outside of the pixel area, and an alignment key area located outside of the pixel area are included, the substrate having a first surface and a second surface opposing the first surface, an interconnection structure disposed below the first surface of the substrate, photoelectric conversion elements disposed in the pixel area of the substrate, an insulating layer disposed on the second surface of the substrate, a grid layer disposed on the insulating layer disposed in the pixel area and the insulating layer disposed in the alignment key area, a key pattern layer disposed between the insulating layer disposed in the alignment key area and the grid layer disposed in the alignment key area, the key pattern layer including a protruding region to correspond to the grid layer, and color filters disposed on the insulating layer disposed in the pixel area and the grid layer disposed in the pixel area.

According to another aspect of an example embodiment, there is provided an image sensor including a substrate including a pixel area that includes a plurality of unit pixels and an alignment key area disposed outside of the pixel area, photoelectric conversion elements disposed in the pixel area of the substrate, an insulating layer disposed on a surface of the substrate, a grid layer disposed on the insulating layer, a key pattern layer disposed between the insulating layer disposed in the alignment key area and the grid layer disposed in the alignment key area, the key pattern layer including regions having different thicknesses, and color filters disposed on the insulating layer disposed in the pixel area and the grid layer disposed in the pixel area.

BRIEF DESCRIPTION OF DRAWINGS

The above and/or other aspects, features, and advantages of example embodiments will be more clearly understood from the following detailed description, taken in conjunction with the accompanying drawings, in which.

DETAILED DESCRIPTION

Figure 1:
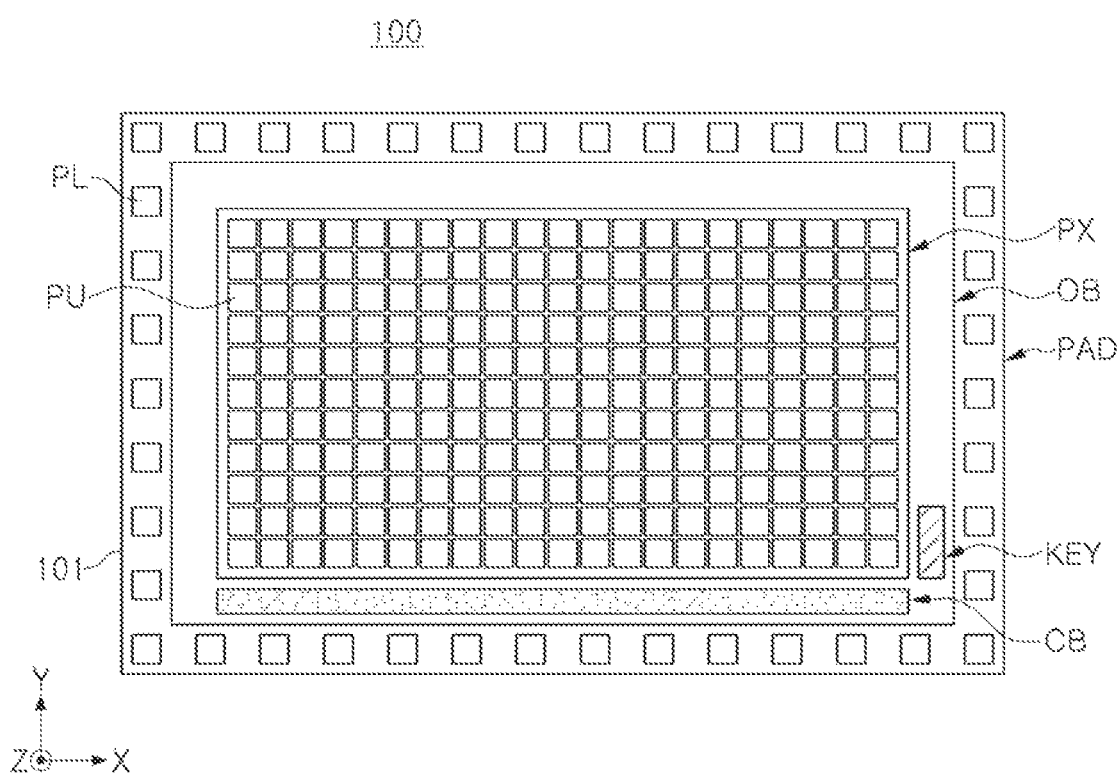
FIG. 1 is a diagram illustrating a schematic layout of an image sensor according to example embodiments.

Hereinafter, example embodiments will be described with reference to the accompanying drawings.

Hereinafter, terms such as 'on', 'upper portion', 'upper surface', 'below', 'lower portion', 'lower surface' and 'side surface' may be understood as being referred based on drawings, unless otherwise indicated by reference numerals.

FIG. 1 is a diagram illustrating a schematic layout of an image sensor according to example embodiments.

Referring to FIG. 1, an image sensor 100 may include a pixel area PX including an active pixel generating an active signal corresponding to wavelengths of light from an external source, an optical black area OB including an optical black pixel for generating an optical black signal by blocking light from an external source, and a pad area PAD exchanging electrical signals with an external device. In the image sensor 100, the pixel area PX, the optical black area OB, and the pad area PAD illustrated in FIG. 1 may form one upper chip structure including a substrate 101. A lower chip structure including a peripheral circuit area may be coupled to a lower portion of the upper chip structure, which will be described in more detail below with reference to FIGS. 2A and 2B. However, according to example embodiments, the image sensor 100 may not further include the lower chip structure, but may further include a peripheral circuit area disposed outside of the pixel area PX. The image sensor 100 may further include a connection area CB and an alignment key area KEY disposed outside of the pixel area PX.

The pixel area PX may include a plurality of unit pixels PU arranged in a matrix form. Each of the plurality of unit pixels PU may include a photoelectric conversion element. In example embodiments, a dummy pixel area may be further disposed outside of the pixel area PX.

The optical black area OB may be disposed outside of the pixel area PX, and may be disposed to surround at least a portion of the pixel area PX or may be disposed to surround the entire pixel area PX as illustrated in FIG. 1. The optical black area OB may include unit pixels PU, as optical black pixels used to measure a dark current.

The pad area PAD may be positioned along the periphery of the substrate 101 outside of the pixel area PX and the optical black area OB. The pad area PAD may include input/output pads PL for transmitting/receiving electrical signals to and from an external device. In example embodiments, the input/output pads PL may serve to transfer driving power such as a power voltage or a ground voltage supplied from an external source to circuits disposed in the peripheral circuit area of the image sensor 100.

The connection area CB and the alignment key area KEY may respectively be disposed outside of the pixel area PX. For example, the connection area CB and the alignment key area KEY may be located to be at least partially surrounded by the optical black area OB, but embodiments are not limited thereto. The connection area CB may be a region in which connection vias for electrically connecting the upper chip structure and the lower chip structure are disposed. The alignment key area KEY may be located between the optical black area OB and the pad area PAD. The alignment key area KEY may be an area in which keys used to align the lower layer and the upper layer during manufacture of the image sensor 100 are disposed. The alignment key area KEY may be disposed in the image sensor 100 as illustrated in FIG. 1, and may be further disposed in a scribe area between the image sensors 100. In the case of the alignment key area KEY disposed in the scribe area, sawing is performed during the manufacturing process, and thus, the alignment key area may not finally remain in the image sensor 100.

Figure 2A:
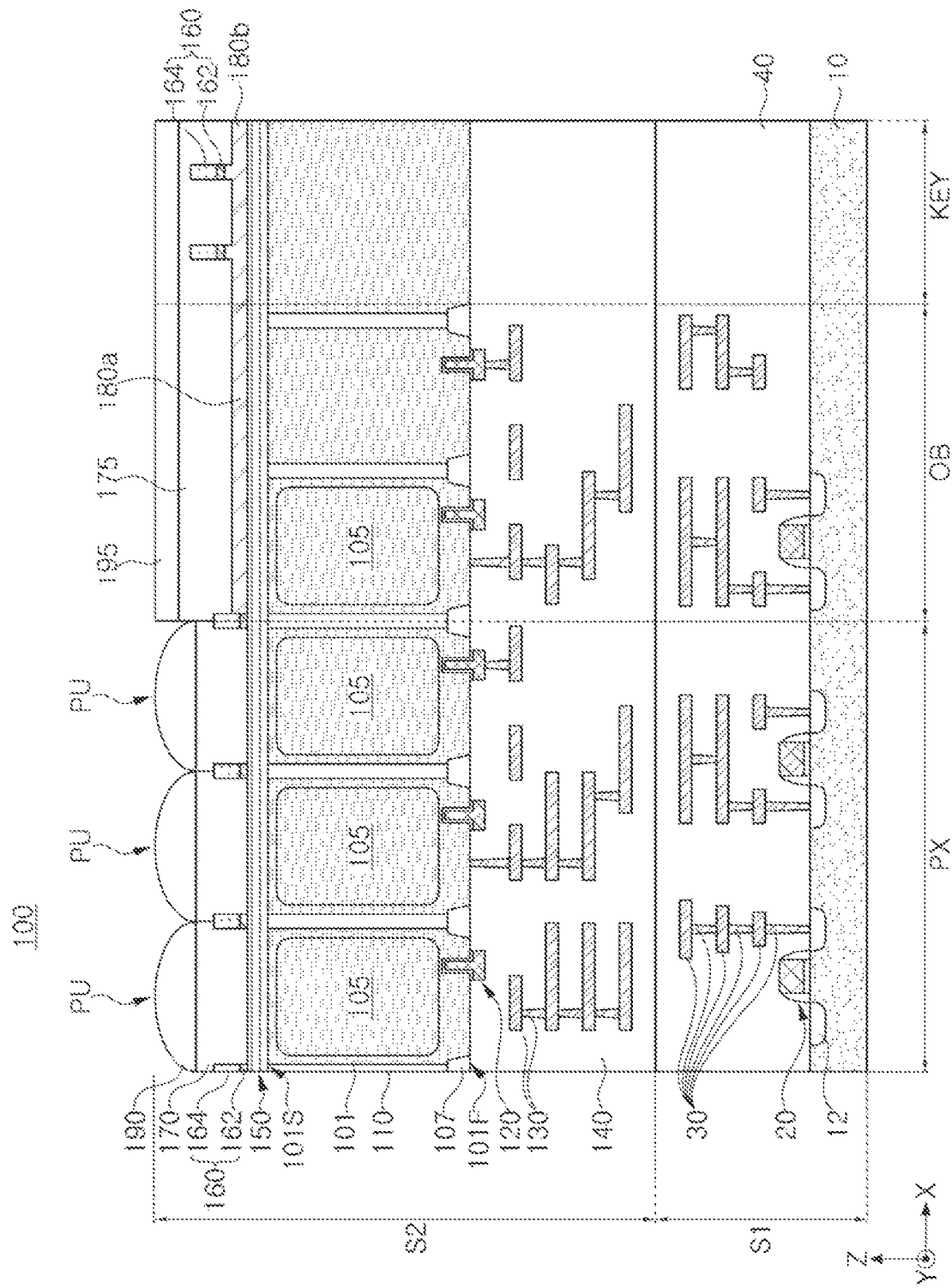
FIGS. 2A and 2B are schematic cross-sectional views illustrating an image sensor according to example embodiments.
Figure 2B:
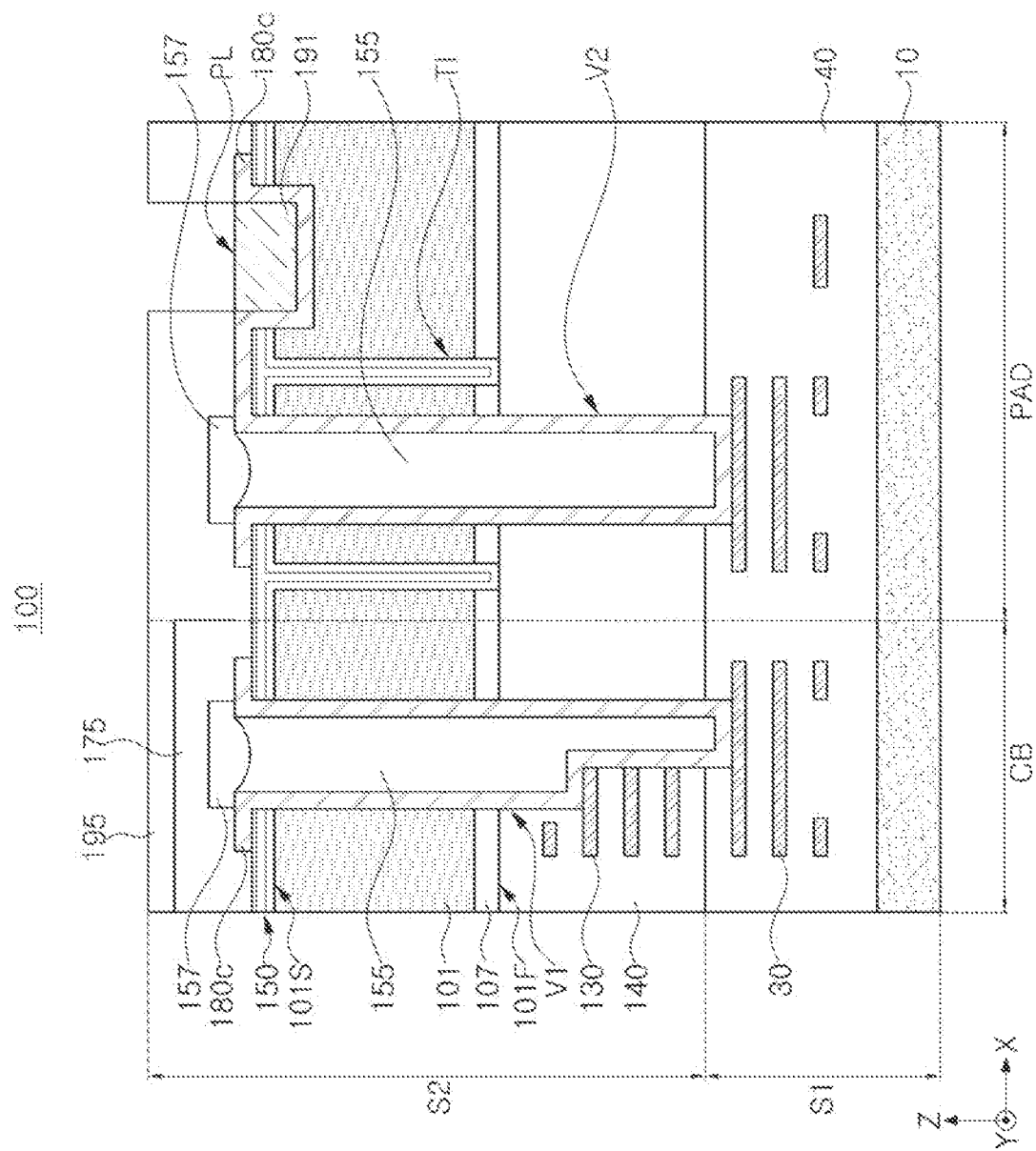

FIGS. 2A and 2B are schematic cross-sectional views illustrating an image sensor according to example embodiments. FIG. 2A illustrates the pixel area PX, the optical black area OB, and the alignment key area KEY of the image sensor 100 of FIG. 1, and FIG. 2B illustrates the connection area CB and the pad area PAD of the image sensor 100.

Referring to FIGS. 2A and 2B, the image sensor 100 may include a first chip structure S1 and a second chip structure S2 that are stacked and disposed in one direction, for example, in the Z direction. The first chip structure S1 may have a circuit area driving the unit pixels PU of the pixel area PX, and the second chip structure S2 may have the pixel area PX, the optical black area OB, the connection area CB, the alignment key area KEY, and the pad area PAD.

In example embodiments, the image sensor 100 may further include a memory chip electrically connected to the circuit area of the first chip structure S1 to transmit and receive image data. In example embodiments, the image sensor 100 does not necessarily have to include the first chip structure S1 and the second chip structure S2, and for example, the first chip structure S1 may be omitted. In this case, the circuit area driving the unit pixels PU may be disposed outside of the pixel area PX in a second substrate 101.

The first chip structure S1 may include a first substrate 10, circuit elements 20, a first interconnection structure 30, and a first insulating layer 40.

The first substrate 10 may be a semiconductor substrate. The first substrate 10 may include, for example, a semiconductor material, such as a group IV semiconductor. For example, the group IV semiconductor may include silicon, germanium, or silicon-germanium. The first substrate 10 may be provided as a bulk wafer, an epitaxial layer, an silicon-on-insulator (SOI) layer, or a semiconductor-on-insulator (SeOI) layer. The first substrate 10 may include impurity regions 12.

The circuit elements 20 may include circuit transistors including a gate electrode layer, a gate insulating layer, and source/drain regions in the impurity regions 12. The circuit elements 20 may provide a signal to the unit pixels PU of the second chip structure S2 or control an output signal from respective unit pixels PU.

The first interconnection structure 30 may be an interconnection structure electrically connected to the circuit elements 20. The first interconnection structure 30 may include interconnection lines and contact plugs. The number of layers of the interconnection lines in the first interconnection structure 30, and the number and arrangement of the interconnection lines and the contact plugs may be variously changed in example embodiments. The first interconnection structure 30 may be formed of a conductive material and may include at least one of, for example, tungsten (W), copper (Cu), aluminum (Al), gold (Au), silver (Ag), and alloys thereof. FIGS. 2A and 2B illustrate that the first interconnection structure 30 is not disposed in the alignment key area KEY, but embodiment are not limited thereto. According to example embodiments, the first interconnection structure 30 connected to the pad area PAD and the like may be further disposed in the alignment key area KEY.

The first insulating layer 40 may be formed of an insulating material, and may be formed of one or a plurality of layers. For example, the first insulating layer 40 may include silicon oxide and/or silicon nitride. The first insulating layer 40 may further include a bonding layer for bonding with the second chip structure S2. The bonding layer may be disposed to have a predetermined thickness from the upper surface of the first insulating layer 40. The bonding layer may be formed of an insulating material, and may include, for example, at least one of silicon oxide (SiO), silicon nitride (SiN), silicon carbon nitride (SiCN), silicon oxycarbide (SiOC), silicon oxynitride (SiON), and SiOCN.

The second chip structure S2 may be disposed on the first chip structure S1 to be electrically connected to the first chip structure S1. The second chip structure S2 may include a second substrate 101, a second interconnection structure 130, a second insulating layer 140, and a third insulating layer 150. As described above with reference to FIG. 1, the second chip structure S2 includes the pixel area PX, the optical black area OB, the alignment key area KEY, the connection area CB, and the pad area PAD.

The second substrate 101 may have a first surface 101F facing the first chip structure S1, and a second surface 101S opposing the first surface 101F. In the second substrate 101, the pixel area PX, the optical black area OB, the alignment key area KEY, the connection area CB, and the pad area PAD may be defined. The second substrate 101 may be a semiconductor substrate. For example, the second substrate 101 may be formed of a p-type silicon substrate. In example embodiments, the second substrate 101 may include a p-type bulk substrate and a p-type or n-type epitaxial layer grown thereon. Alternatively, the second substrate 101 may include an n-type bulk substrate and a p-type or n-type epitaxial layer grown thereon. According to example embodiments, the second substrate 101 may be formed of an organic plastic substrate. The image sensor 100 may constitute, for example, a backside illumination type complementary metal-oxide-semiconductor (CMOS) image sensor in which light is incident on the second surface 101S of the second substrate 101.

The second interconnection structure 130 may be disposed between the first surface 101F of the second substrate 101 and the first chip structure S1 together with the second insulating layer 140. The second interconnection structure 130 may be an interconnection structure that is electrically connected to components in the second substrate 101 and on the second substrate 101. The second interconnection structure 130 may include interconnection lines and contact plugs. The number of layers of the interconnection lines in the second interconnection structure 130 and the number and arrangement of the interconnection lines and the contact plugs may be variously changed in example embodiments. The second interconnection structure 130 may be formed of a conductive material, and may include, at least one of, for example, tungsten (W), copper (Cu), aluminum (Al), gold (Au), silver (Ag), and alloys thereof.

The second insulating layer 140 may be formed of an insulating material, and may be formed of one or a plurality of layers. For example, the second insulating layer 140 may include silicon oxide and/or silicon nitride. Similar to the first insulating layer 40, the second insulating layer 140 may further include a bonding layer for bonding with the first chip structure S1. The bonding layer may be disposed to have a predetermined thickness from the lower surface of the second insulating layer 140.

The third insulating layer 150 may include a plurality of layers 152, 154 and 156 (see FIG. 3) sequentially stacked on the second surface 101S of the second substrate 101. For example, the third insulating layer 150 may include at least two or more of an aluminum oxide layer, a hafnium oxide layer, a tantalum oxide layer, a zirconium oxide layer, a silicon oxynitride layer, a silicon oxide layer, and a silicon nitride layer. In example embodiments, the third insulating layer 150 may include a fixed charge layer and/or an anti-reflection layer. The anti-reflection layer may be provided such that incident light may proceed to photoelectric conversion element 105 with relatively high transmittance by adjusting a refractive index.

Referring to FIG. 2A, the pixel area PX may further include the photoelectric conversion elements 105, device isolation regions 107, and pixel isolation regions 110, which are disposed in the second substrate 101, pixel elements 120 disposed in the second insulating layer 140, and grid layers 160, color filters 170, and microlenses 190 disposed on the second surface 101S of the second substrate 101.

The photoelectric conversion elements 105 are disposed in the second substrate 101 and may absorb incident light to generate and accumulate electric charges corresponding to the amount of light. The photoelectric conversion elements 105 may include at least one of a photo diode, a photo transistor, a photo gate, a pinned photo diode (PPD), and combinations thereof. When the photoelectric conversion elements 105 include a photodiode, the photoelectric conversion elements 105 may include an impurity region having a conductivity type different from that of the second substrate 101, and may form a PN junction with a well region in the second substrate 101.

The device isolation regions 107 may include an insulating material and may be disposed in the second substrate 101 to a predetermined depth from the first surface 101F of the second substrate 101.

The pixel isolation regions 110 may be disposed in the second substrate 101, below the boundary of respectively unit pixels PU. The pixel isolation regions 110 may be connected to the device isolation regions 107 on a lower surface thereof. However, depending on example embodiments, the arrangement of the pixel isolation regions 110 in the second substrate 101 in the Z direction may be variously changed. The pixel isolation regions 110 may be disposed to surround the photoelectric conversion elements 105. However, the relative arrangement relationship between the pixel isolation regions 110 and the photoelectric conversion elements 105 is not limited to the illustration in the drawing, and may be variously changed in example embodiments. For example, the lower surfaces of the pixel isolation regions 110 may be positioned higher or lower than the lower surfaces of the photoelectric conversion elements 105. The pixel isolation regions 110 may include an insulating material or a conductive material. For example, when the pixel isolation regions 110 include a conductive material, an insulating layer disposed between the second substrate 101 and the pixel isolation regions may be further included.

The pixel elements 120 may be disposed between the photoelectric conversion elements 105 and the second interconnection structure 130. The pixel elements 120 may constitute a pixel circuit of the unit pixel PU. For example, the pixel elements 120 may include a transfer gate constituting a transfer transistor, as illustrated in FIG. 2A. The transfer gate may be a vertical transistor gate including a portion extending into the second substrate 101 from the first surface 101F of the second substrate 101. In addition to the transfer gate, the pixel elements 120 may further include a floating diffusion region in the second substrate 101, and gates on the first surface 101F of the second substrate 101. The gates may constitute a source follower transistor, a reset transistor, and a select transistor.

The grid layers 160 may be disposed between the color filters 170 on the third insulating layer 150, to separate the color filters 170 from each other. The grid layers 160 may be disposed on the third insulating layer 150 and may be disposed on the boundary of respective unit pixels PU. The grid layers 160 may be disposed above the pixel isolation regions 110 in a Z direction perpendicular to one surface of the second substrate 101. The grid layers 160 may include first grid layer 162 and a second grid layer 164 sequentially stacked from the bottom. The first grid layer 162 is, for example, a metal barrier layer, and may include a metal material. The first grid layer 162 may include, for example, at least one of titanium (Ti), titanium oxide, tantalum (Ta), and tantalum oxide. The second grid layer 164 may be an insulating layer that is a low refractive index (LRI) layer, and may have a refractive index in the range of, for example, about 1.1 to about 1.8. The second grid layer 164 may include an insulating material, for example, an oxide or nitride including silicon (Si), aluminum (Al), or combinations thereof. For example, the second grid layer 164 may include silicon oxide (SiO) having a porous structure, or silica nanoparticles having a network structure. In example embodiments, a protective layer covering the upper and side surfaces of the grid layers 160 and extending onto the third insulating layer 150 may be further disposed.

The color filters 170 may be disposed on the third insulating layer 150 and the grid layers 160, on the photoelectric conversion elements 105. The color filters 170 may pass light of a specific wavelength therethrough to allow light to reach the photoelectric conversion elements 105 therebelow. The color filters 170 may be implemented as a color filter array including a red (R) filter, a green (G) filter, and a blue (B) filter. The color filter 170 may be formed of, for example, a material obtained by mixing a resin with a pigment including a metal or a metal oxide.

The microlenses 190 are disposed on the color filters 170 to change the path of light incident to an area other than the photoelectric conversion elements 105 to condense light into the photoelectric conversion elements 105. The microlenses 190 may be formed of a transparent photoresist material or a transparent thermosetting resin film. The microlenses 190 may be formed of, for example, a TMR-based resin (manufactured by Tokyo Ohka Kogyo, Co.) or an MFR-based resin (manufactured by Japan Synthetic Rubber Corporation).

Referring to FIG. 2A, the optical black area OB includes the photoelectric conversion element 105, the device isolation regions 107, and the pixel isolation regions 110 disposed in the second substrate 101, and may further include a light-shielding conductive layer 180*a*, a light blocking color filter 175, and a capping layer 195 disposed above the second substrate 101. The optical black area OB may be used to remove a noise signal caused by a dark current. Hereinafter, descriptions overlapping with those described above with reference to the pixel area PX will be omitted.

The photoelectric conversion element 105 may be disposed in the second substrate 101 in a portion of the optical black area OB. In the optical black area OB, a region including the photoelectric conversion element 105 may provide a reference with respect to noise generated by the photoelectric conversion element 105. In the optical black area OB, a region in which the photoelectric conversion element 105 is not disposed may provide a reference with respect to process noise caused by elements other than the photoelectric conversion element 105.

The light-shielding conductive layer 180*a* and the light blocking color filter 175 may form a light blocking pattern that blocks light, and may block light from entering the lower second substrate 101 provided below the light-shielding conductive layer 180*a* and the light blocking color filter 175. The light-shielding conductive layer 180*a* may include, for example, a metal material. The light-shielding conductive layer 180*a* may include, for example, at least one of tungsten (W), titanium (Ti), copper (Cu), aluminum (Al), gold (Au), silver (Ag), and alloys thereof. The light blocking color filter 175 may include, for example, a blue (B) filter.

The capping layer 195 may be disposed on the light blocking color filter 175 and may be formed of the same material as the microlenses 190, but is not limited thereto.

Referring to FIG. 2A, the alignment key area KEY may further include a key pattern layer 180*b*, grid layers 160, a light blocking color filter 175, and a capping layer 195, disposed on the second substrate 101. The alignment key area KEY may be used to control alignment in a lithography process during a process of manufacturing the image sensor 100.

The key pattern layer 180*b* may be a layer functioning as a light-shielding layer for the alignment key area KEY and forming an alignment key pattern simultaneously therewith. The key pattern layer 180*b* may be disposed between the third insulating layer 150 and the grid layers 160. The key pattern layer 180*b* may include a first region having a flat upper surface and extending along the third insulating layer 150, and a second region protruding and disposed on the first region to correspond to the grid layers 160. The key pattern layer 180*b* will be described in more detail below with reference to FIG. 3. The key pattern layer 180*b* may be formed in the same process operation as the light-shielding conductive layer 180*a* of the optical black area OB and may include the same material. The key pattern layer 180*b* may include, for example, at least one of tungsten (W), titanium (Ti), copper (Cu), aluminum (Al), gold (Au), silver (Ag), and alloys thereof. The key pattern layer 180*b* may have a shape at least partially connected to the light-shielding conductive layer 180*a* of the optical black area OB, but the configuration is not limited thereto.

The light blocking color filter 175 and the capping layer 195 may be disposed to extend from the optical black area OB. According to example embodiments, at least one of the light blocking color filter 175 and the capping layer 195 in the alignment key area KEY may be omitted.

Referring to FIG. 2B, the connection area CB may further include a first connection via V1 including a via conductive layer 180*c* and a via filling layer 155, a buffer layer 157 on the first connection via V1, a light blocking color filter 175, and a capping layer 195.

The first connection via V1 may be disposed for electrical connection between the first chip structure S1 and the second chip structure S2. The first connection via V1 penetrates through the third insulating layer 150, the second substrate 101, and the second insulating layer 140, and may be in contact with the second interconnection structure 130 and may be connected to the first interconnection structure 30 of the first chip structure S1. The first connection via V1 may be bent along the second interconnection structure 130 in a region connected to the second interconnection structure 130 and extend downwardly. Accordingly, the first connection via V1 may have a bent cylindrical shape. According to example embodiments, the first connection via V1 may have a shape in which the width of the first connection via V1 decreases from top to bottom. The via conductive layer 180*c* may be disposed to cover the sidewall and the bottom surface of the first connection via V1. The via conductive layer 180*c* may be formed in the same process operation as the light-shielding conductive layer 180*a* of the optical black area OB and the key pattern layer 180*b* of the alignment key area KEY, and may include the same material. The via conductive layer 180*c* may be formed of a conductive material, for example, at least one of tungsten (W), copper (Cu), aluminum (Al), gold (Au), silver (Ag), and alloys thereof. The via filling layer 155 is disposed to fill the first connection via V1, on the via conductive layer 180*c*, and may have a concave upper surface. The via filling layer 155 may include an insulating material, but the configuration is not limited thereto.

The buffer layer 157 may be disposed to cover the concave upper surface of the via filling layer 155. The buffer layer 157 may include, for example, a cured photoresist material. However, depending on example embodiments, the buffer layer 157 may be omitted.

The light blocking color filter 175 and the capping layer 195 may be disposed to extend from the optical black area OB.

Referring to FIG. 2B, the pad area PAD may further include a second connection via V2 including a via conductive layer 180c and a via filling layer 155, a buffer layer 157 on the first through via V2, a via isolation region T1, an input/output pad PL, and a capping layer 195.

The second connection via V2 may electrically connect the input/output pad PL and the first chip structure S1. An upper portion of the second connection via V2 is connected to the input/output pad PL by the via conductive layer 180c, and a lower portion of the second connection via V2 may penetrate through the third insulating layer 150, the second substrate 101, and the second insulating layer 140 to be connected to the first interconnection structure 30 of the first chip structure S1. The second connection via V2 may have a cylindrical shape. In addition, the description of the first connection via V1 described above may be equally applied to the via conductive layer 180c and the via filling layer 155 of the second connection via V2, and the buffer layer 157.

The via isolation region T1 may be positioned on at least one side of the second connection via V2, and may have a form in which a portion of the third insulating layer 150 may extend into the second substrate 101. The via isolation region T1 may extend in the Z direction within the second substrate 101.

The input/output pad PL may include a region in which the via conductive layer 180c extends, and a pad conductive layer 191 on the via conductive layer 180c. The input/output pad PL may be an area electrically connected to an external device by wire bonding or the like. The pad conductive layer 191 may include a conductive material such as a metal material.

The capping layer 195 may be disposed to cover the buffer layer 157 and the input/output pad PL, and may extend from the optical black area OB.

Figure 3:
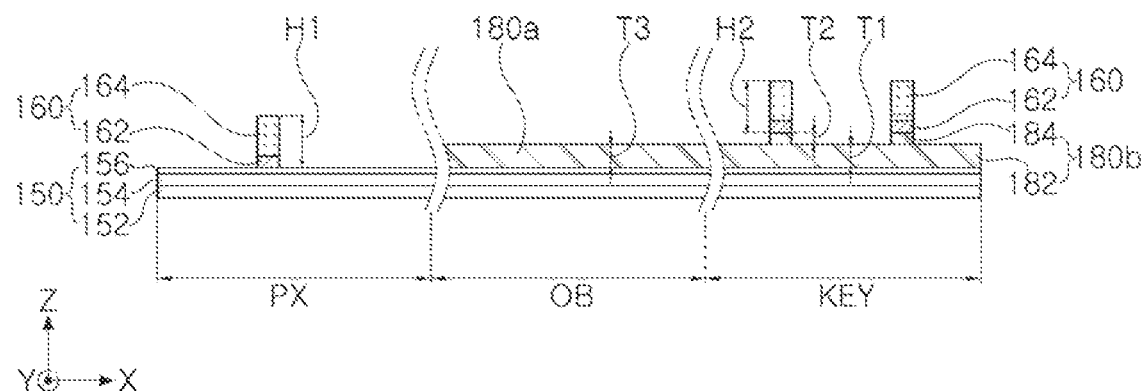
FIG. 3 is a schematic cross-sectional view illustrating a partial configuration of an image sensor according to example embodiments.

FIG. 3 is a schematic cross-sectional view illustrating a partial configuration of an image sensor according to example embodiments.

Figure 4:
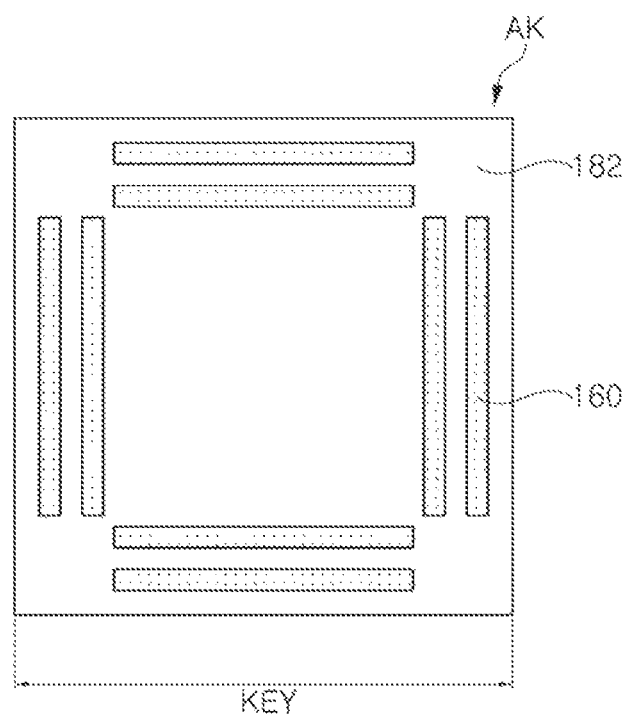
FIG. 4 is a schematic plan view illustrating a partial area of an image sensor according to example embodiments.

FIG. 4 is a schematic plan view illustrating a partial area of an image sensor according to example embodiments.

First, referring to FIG. 3, the third insulating layer 150, the grid layer 160, and the light-shielding conductive layer 180a, and the key pattern layer 180b are illustrated in the pixel area PX, the optical black area OB, and the alignment key area KEY.

The third insulating layer 150 may include first to third layers 152, 154, and 156 sequentially stacked from the bottom. For example, the first layer 152 may be a fixed charge layer having a negative fixed charge. Hole accumulation may occur around the fixed charge layer, thereby effectively reducing the occurrence of dark current and white spots. The third insulating layer 150 may include a metal fluoride or a metal oxide, including at least one of hafnium (Hf), zirconium (Zr), aluminum (Al), tantalum (Ta), titanium (Ti), and yttrium (Y). For example, the first layer 152 and the third layer 156 may be a hafnium oxide layer, and the second layer 154 may be a silicon oxide layer. However, in example embodiments, the number and relative thickness of the layers constituting the third insulating layer 150 may be variously changed. For example, the third insulating layer 150 may further include a silicon nitride layer disposed between the second layer 154 and the third layer 156.

The grid layer 160 may be disposed on the upper surface of the third insulating layer 150 in the pixel area PX, and may be disposed on the key pattern layer 180b in the alignment key area KEY. The lower surface of the grid layer 160 may directly contact the upper surface of the third insulating layer 150 in the pixel area PX, and directly contact the uppermost surface of the key pattern layer 180b in the alignment key area KEY. The grid layer 160 has a first height H1 in the pixel area PX, a second height H2 in the alignment key area KEY, and the first height H1 and the second height H2 may be substantially the same as each other. Substantially the same may be a case in which it is the same, or there is a difference within the range of a deviation that may occur in the manufacturing process. Accordingly, the grid layer 160 may be positioned on a higher height level in the alignment key area KEY than in the pixel area PX, and the upper surface of the grid layer 160 in the alignment key area KEY may be located on a height level higher than that of the upper surface of the grid layer 160 in the pixel region PX. The first height H1 and the second height H2 may have a range of, for example, about 2500 Å to about 4500 Å. The grid layer 160 may include first and second grid layers 162 and 164 sequentially stacked.

The light-shielding conductive layer 180a and the key pattern layer 180b may include a material different from the third insulating layer 150. For example, the light-shielding conductive layer 180a and the key pattern layer 180b may include a material different from a material of the third layer 156 that is an uppermost layer of the third insulating layer 150, to obtain the etching selectivity with respect to the third insulating layer 150 during the manufacturing process. The light-shielding conductive layer 180a and the key pattern layer 180b may include, for example, a metal material, but embodiments are not limited thereto. In an example embodiment, the key pattern layer 180b may include a material different from the first grid layer 162, but embodiments are not limited thereto.

In the alignment key area KEY, the key pattern layer 180b may include areas having different thicknesses. The key pattern layer 180b may include a first region 182 and a second region 184 protruding from the first region 182 to correspond to the grid layer 160. The key pattern layer 180b has the second region 184 forming a protrusion, and thus, a step may be formed on the upper surface of the key pattern layer 180b. The second region 184 may have side surfaces that are substantially coplanar with side surfaces of the grid layer 160.

Referring to FIG. 4, in the alignment key area KEY, the second region 184 of the key pattern layer 180b and the grid layer 160 may protrude onto the first region 182, and may constitute an alignment key pattern in an alignment key AK. In the alignment key area KEY, one or more alignment keys AK having the same or similar alignment key pattern as above may be disposed. In the alignment key AK, the pattern shape of the alignment key pattern may be variously changed depending on a lithographic apparatus or the like used in a manufacturing process. As the image sensor 100 further includes the key pattern layer 180b in the alignment key area KEY, compared to the case in which the alignment key pattern is formed only with the grid layer 160 on the third insulating layer 150, alignment of layers formed after the grid layer 160, with respect to the grid layer 160, may be improved by increasing a signal of the alignment key pattern. For example, alignment of the color filters 170 and the microlenses 190 with respect to the grid layer 160 may be improved. The signal of the alignment key pattern may indicate a signal according to image analysis of the alignment key pattern for alignment, and may depend on the thickness and transmittance of a material constituting the alignment key pattern.

In the key pattern layer 180b, the first region 182 may have a first thickness T1 and the second region 184 may have a second thickness T2. The first thickness T1 may be substantially the same as a third thickness T3 of the light-shielding conductive layer 180a of the optical black area OB. Accordingly, the key pattern layer 180b has a maximum thickness in a region including the second region 184, and the maximum thickness may be greater than a maximum thickness of the light-shielding conductive layer 180a. The second thickness T2 may be less than the first thickness T1, but the configuration is not limited thereto. For example, the first thickness T1 and the third thickness T3 may range from about 1000 Å to about 3000 Å. The second thickness T2 may be about 100 Å or more, for example, may range from about 100 Å to about 1000 Å.

Figure 5A:
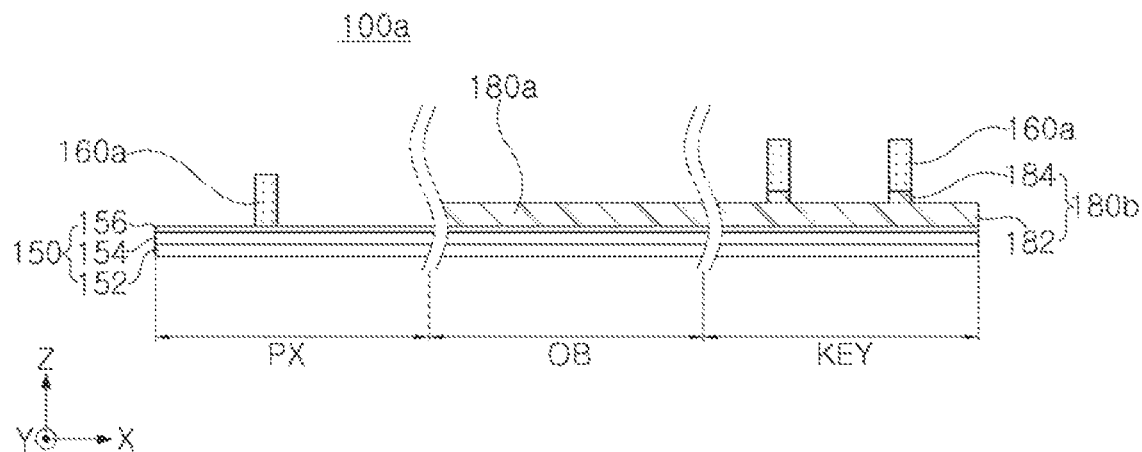
FIGS. 5A and 5B are schematic cross-sectional views illustrating partial configurations of an image sensor according to example embodiments.
Figure 5B:
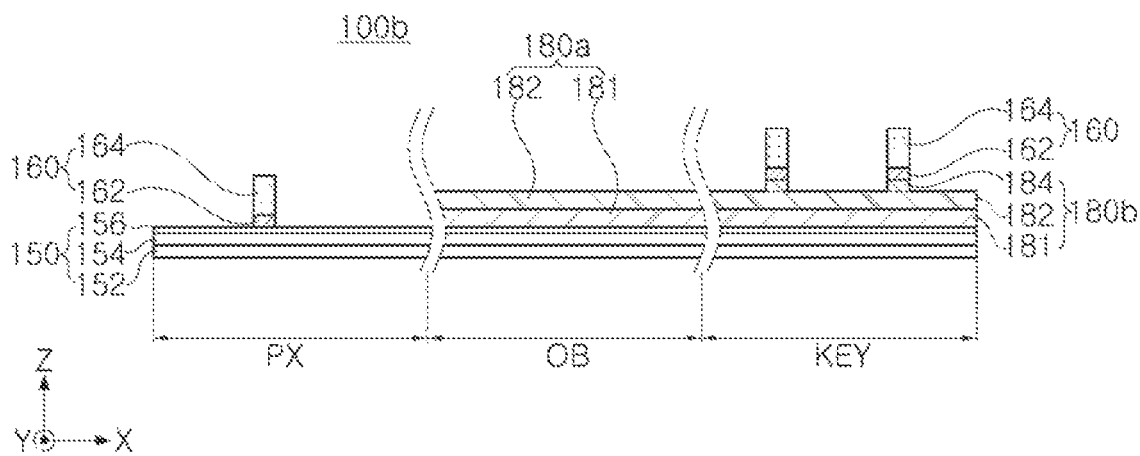

FIGS. 5A and 5B are schematic cross-sectional views illustrating some configurations of an image sensor according to example embodiments. FIGS. 5A and 5B illustrate an area corresponding to FIG. 3.

Referring to FIG. 5A, in an image sensor 100a, a grid layer 160a may be formed of a single layer, unlike in the example embodiment of FIGS. 2A to 3. In detail, the grid layer 160a may not include a metal barrier layer corresponding to the first grid layer 162 of FIG. 3, but may be formed of only a low refractive index layer corresponding to the second grid layer 164. Accordingly, even when the grid layer 160a is formed of a low refractive index layer having relatively high transmittance, since the alignment key area KEY includes the key pattern layer 180b, a signal of the alignment key pattern may be secured.

Referring to FIG. 5B, in an image sensor 100b, each of the light-shielding conductive layer 180a and the key pattern layer 180b may further include a lower layer 181. In addition, in regions corresponding to the connection area CB and the pad area PAD of FIG. 2B, the via conductive layer 180c may further include a lower layer 181, but the configuration is not limited thereto. In this case, in the key pattern layer 180b, the first region 182 and the second region 184 may also be formed of one layer having a step or protrusion. As such, in example embodiments, the light-shielding conductive layer 180a and the key pattern layer 180b may be formed of a plurality of layers as described above.

Figure 6:
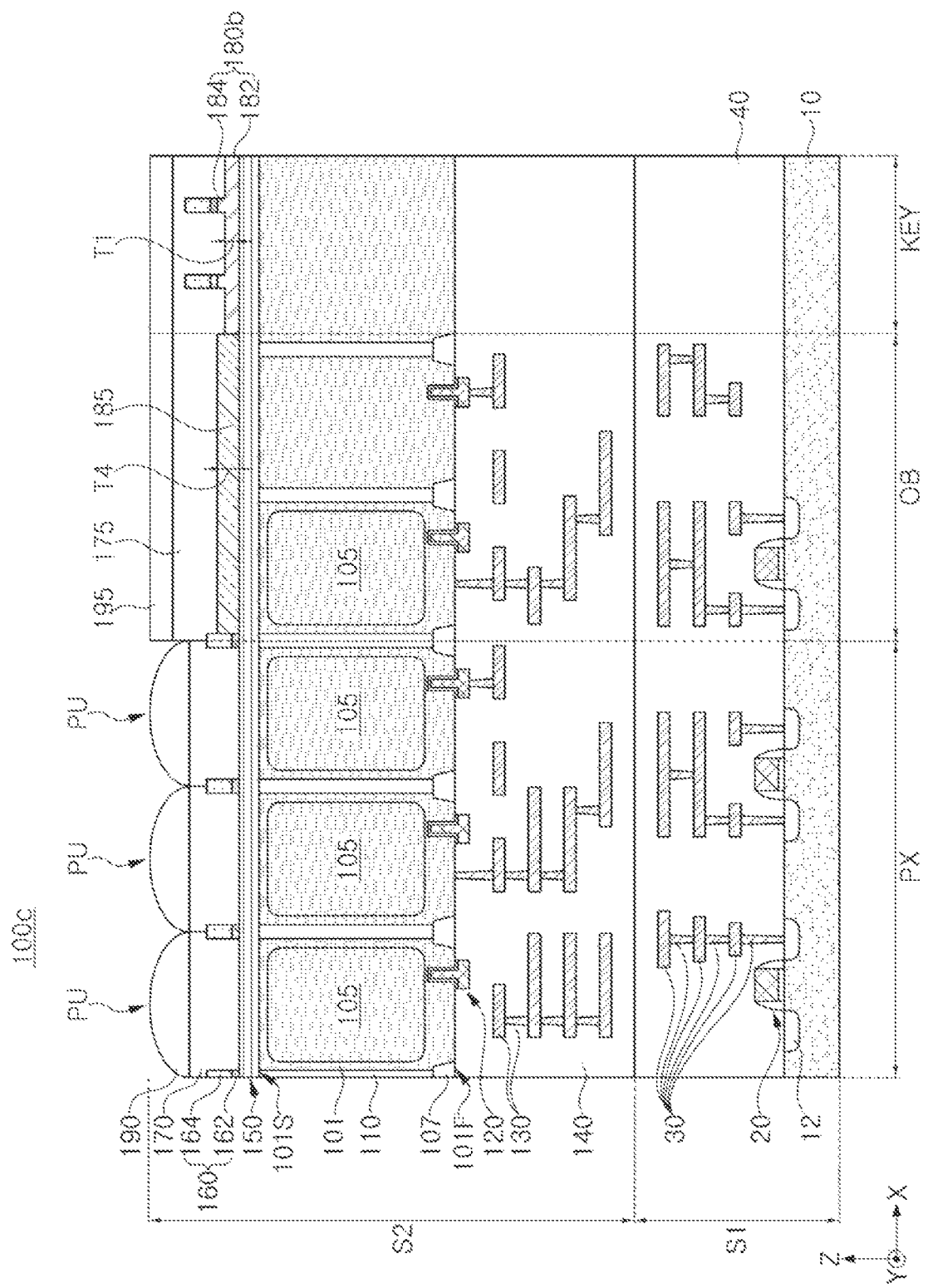
FIG. 6 is a schematic cross-sectional view illustrating an image sensor according to example embodiments.

FIG. 6 is a schematic cross-sectional view illustrating an image sensor according to example embodiments.

Referring to FIG. 6, an image sensor 100c may include a light blocking metal layer 185 disposed on the third insulating layer 150 of the optical black area OB. Unlike the light-shielding conductive layer 180a in the example embodiment of FIGS. 2A to 3, the light blocking metal layer 185 may be a layer including a material different from the key pattern layer 180b of the alignment key area KEY. In this example embodiment, the key pattern layer 180b of the alignment key area KEY may be a layer formed in a process operation separate from layers disposed in the optical black area OB. A thickness T4 of the light blocking metal layer 185 may be different from the thickness T1 of the first region 182 of the key pattern layer 180b, but embodiments are not limited thereto.

In regions corresponding to the connection area CB and the pad area PAD of FIG. 2B, the via conductive layer 180c is formed in the same process operation as the light blocking metal layer 185 or the key pattern layer 180b, and may include the same material as the metal layer 185 or the key pattern layer 180b.

Figure 7A:
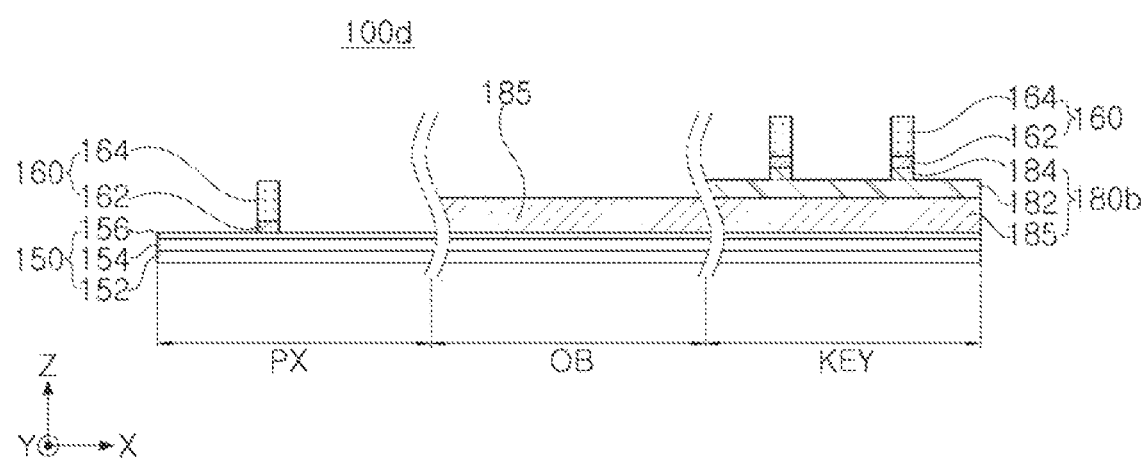
FIGS. 7A and 7B are schematic cross-sectional views illustrating partial configurations of an image sensor according to example embodiments.
Figure 7B:
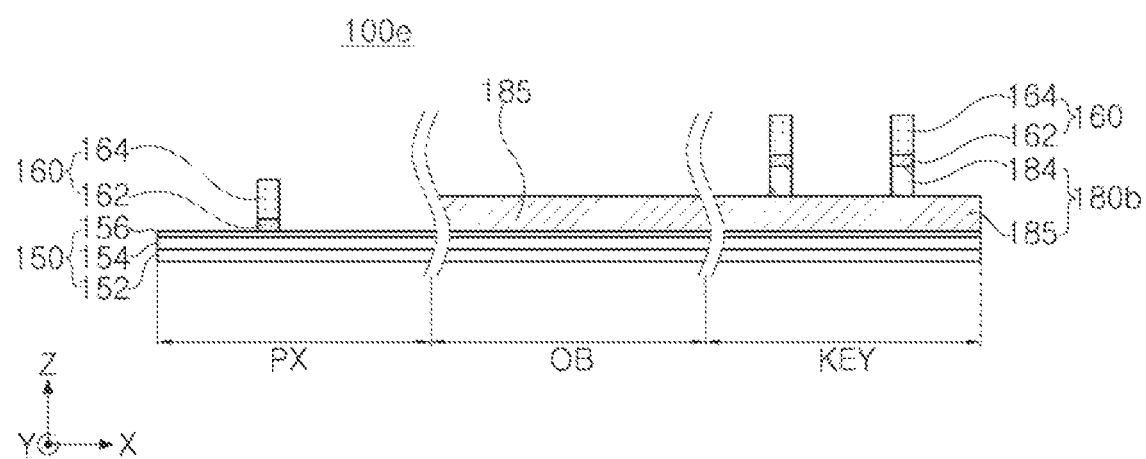

FIGS. 7A and 7B are schematic cross-sectional views illustrating an image sensor according to example embodiments. FIGS. 7A and 7B illustrate an area corresponding to FIG. 3.

Referring to FIG. 7A, an image sensor 100d may include a light blocking metal layer 185 disposed on the third insulating layer 150 of the optical black area OB, and the key pattern layer 180b of the alignment key area KEY may further include the light blocking metal layer 185 disposed on the third insulating layer 150. In this example embodiment, the key pattern layer 180b further includes the light blocking metal layer 185 of the optical black area OB, and thus, may have a structure in which the first region 182 and the second region 184 are disposed on the light blocking metal layer 185, unlike the example embodiment of FIG. 6.

In regions corresponding to the connection area CB and the pad area PAD of FIG. 2B, the via conductive layer 180c is formed in the same process operation as the light blocking metal layer 185, and may include the same material as the light blocking metal layer 185. Alternatively, the via conductive layer 180c is formed in the same process operation as the first region 182 and the second region 184 and may include the same material as the first region 182 and the second region 184.

Referring to FIG. 7B, an image sensor 100e includes a light blocking metal layer 185 disposed on the third insulating layer 150 of the optical black area OB, and a key pattern layer 180b of the alignment key area KEY may include a light blocking metal layer 185 and a patterned second region 184, disposed on the third insulating layer 150. In this example embodiment, the key pattern layer 180b may have a form in which the first region 182 is also patterned in the alignment key area KEY, unlike the example embodiment of FIG. 7A. Accordingly, in the key pattern layer 180b of this example embodiment, the light blocking metal layer 185 may be a first region, and the second region 184 may be provided directly on the light blocking metal layer 185.

FIGS. 8A to 8F are schematic cross-sectional views illustrating a method of manufacturing an image sensor according to example embodiments.

Figure 8A:
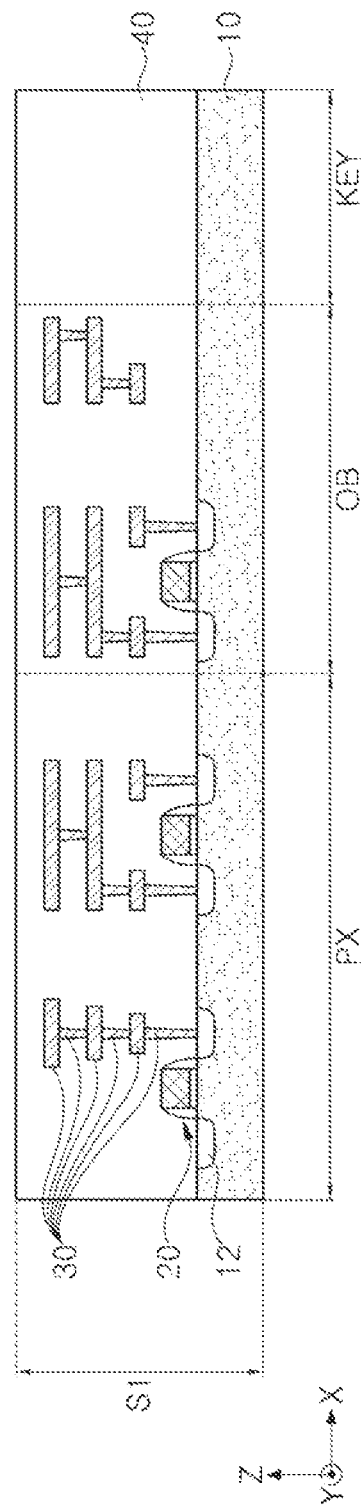
FIGS. 8A, 8B, 8C, 8D, 8E, and 8F are schematic cross-sectional views illustrating a method of manufacturing an image sensor according to example embodiments.

Referring to FIG. 8A, a first chip structure S1 may be prepared.

After forming regions required for circuit configuration, such as device isolation regions and impurity regions 12 in a first substrate 10, circuit elements 20 may be formed on the first substrate 10. Next, a portion of a first insulating layer 40 covering the circuit elements 20 is formed, a layer of a first interconnection structure 30 is formed from the lower portion, and then, a portion of the first insulating layer 40 may also be formed. By repeating such a process, the first interconnection structure 30 and the first insulating layer 40 may be formed.

Figure 8B:
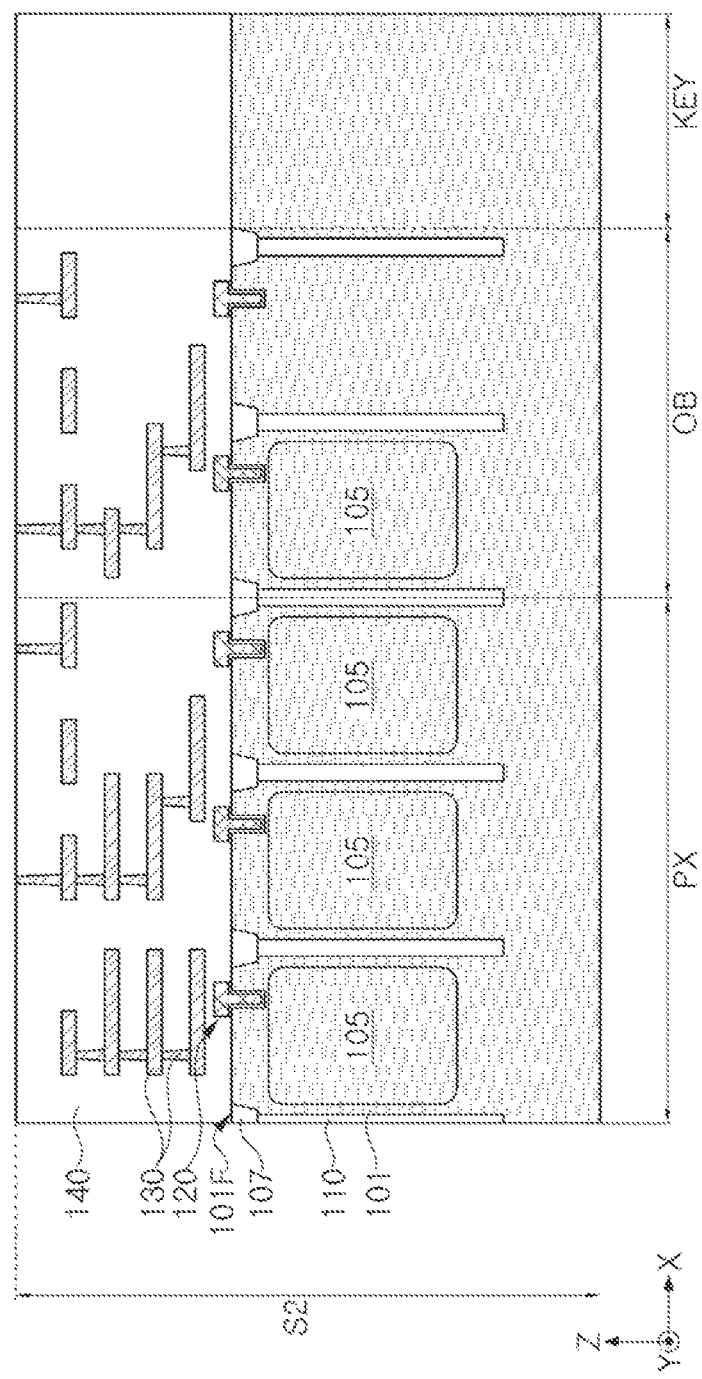

Referring to FIG. 8B, a portion of a second chip structure S2 including a first region of the second chip structure S2 may be formed. The first region may include a configuration in the second substrate 101 and a configuration in the second insulating layer 140, among the configurations of the second chip structure S2.

First, a portion of the components disposed in the second substrate 101, including device isolation regions 107, pixel isolation regions 110, and photoelectric conversion elements 105, may be formed in the second substrate 101. However, according to example embodiments, the pixel isolation regions 110 may be formed in a subsequent operation described with reference to FIG. 8C. The second substrate 101 may have a thickness greater than the final thickness of the second substrate 101 of FIG. 2A. For example, the photoelectric conversion elements 105 may be formed by implanting impurities from the first surface 101F of the second substrate 102 through an ion implantation process.

Next, the pixel elements 120, the second interconnection structure 130, and the second insulating layer 140 may be formed to configure the pixel circuit on the first surface 101F of the second substrate 101. The second insulating layer 140 may be partially formed in the process of forming the second interconnection structure 130, and may be finally formed to cover the components on the second substrate 101.

Figure 8C:
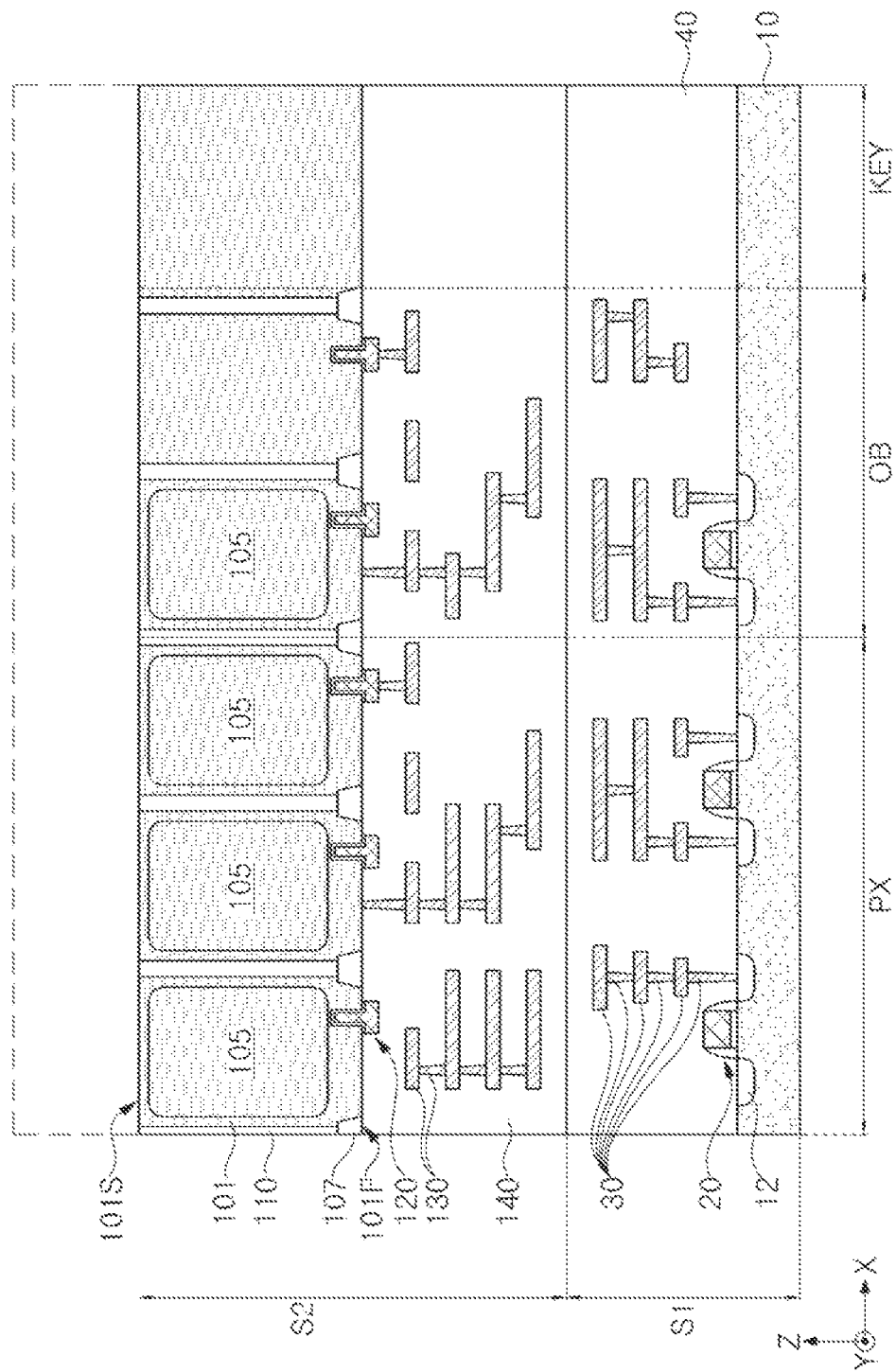

Referring to FIG. 8C, the first chip structure S1 and the second chip structure S2 may be bonded.

In detail, bonding of the first chip structure S1 and the second chip structure S2 may be performed by bonding of the first insulating layer 40 of the first substrate structure S1 and the second insulating layer 140 of the second chip structure S2. For example, when the bonding layer on the first insulating layer 40 and the bonding layer below the second insulating layer 140 are formed of the same material, bonding may be performed by pressing without a separate adhesive layer. According to example embodiments, bonding of the first chip structure S1 and the second chip structure S2 may also be performed by bonding with separate bonding pads, for example, copper (Cu)-to-copper (Cu) bonding.

After bonding the first chip structure S1 and the second chip structure S2, the second substrate 101 may be partially removed from the upper surface by a thinning process to form the second surface 101S. A portion of the second substrate 101 may be removed by a polishing process or a back grinding process.

Figure 8D:
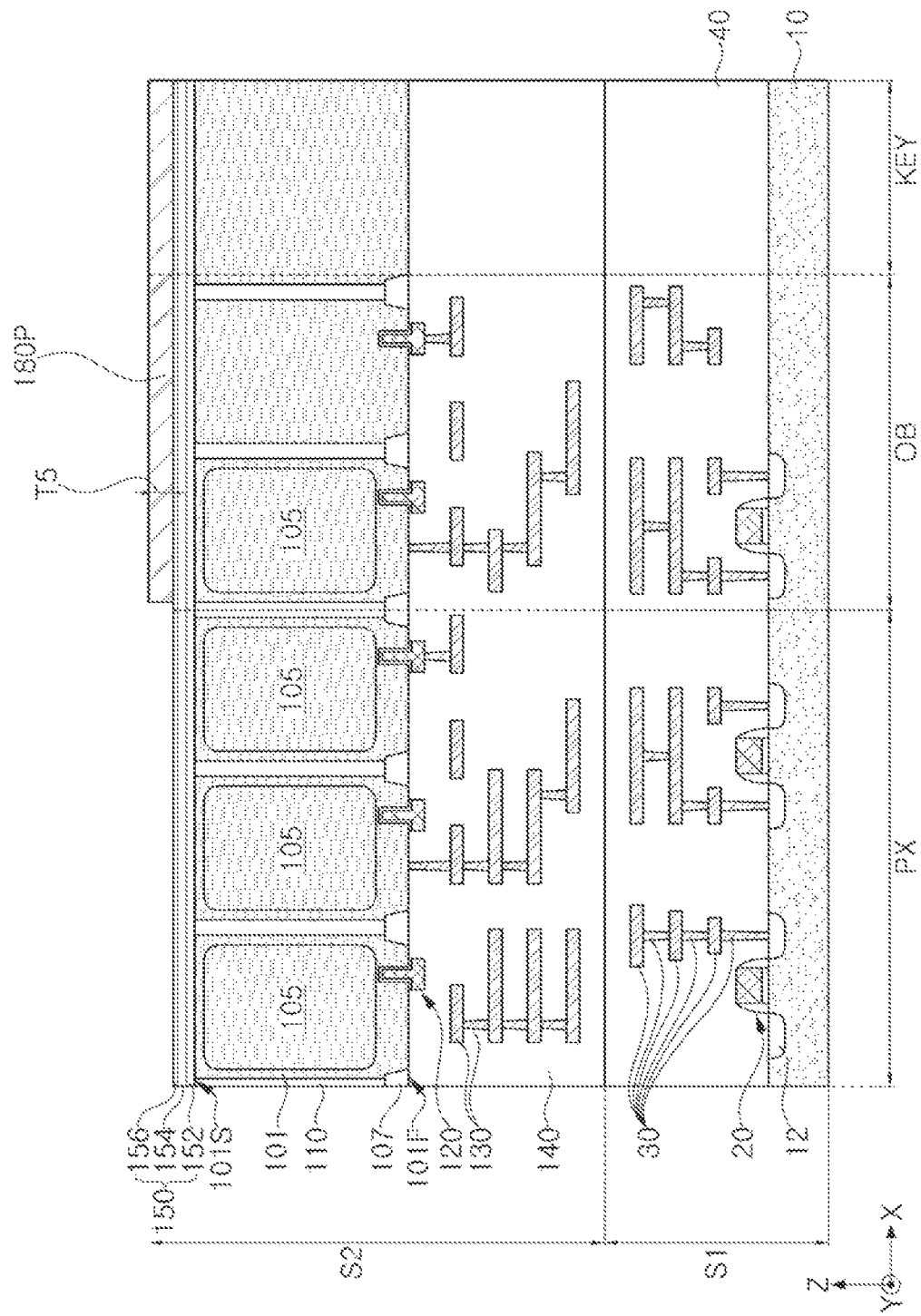

Referring to FIG. 8D, a portion of the second region of the second chip structure S2 may be formed on the second surface 101S of the second substrate 101. The second region may include the third insulating layer 150 and layers on the third insulating layer 150.

The third insulating layer 150 may be formed on the second surface 101S of the second substrate 101, and a preliminary conductive layer 180P may be formed in regions excluding the pixel area PX. The preliminary conductive layer 180P is deposited on the entire area, and may then be removed from the pixel area PX. The preliminary conductive layer 180P may have a fifth thickness T5 that may correspond to a maximum thickness of the key pattern layer 180b in the final structure, for example, a sum of thicknesses of the first region 182 and the second region 184 of FIG. 2A.

In this operation, in the connection area CB and the pad area PAD of FIG. 2B, after the third insulating layer 150 is formed, a via hole for the first and second connection vias V1 and V2 and a concave portion for the input/output pad PL may be formed. Next, the preliminary conductive layer 180P may be formed to extend into the via holes and the concave portion, and may be patterned. Next, the via filling layer 155 is formed to form the first and second connection vias V1 and V2, and the buffer layer 157 may be formed on the upper surfaces of the first and second connection vias V1 and V2. A pad conductive layer 191 may be further formed in the concave portion to form the input/output pad PL.

Figure 8E:
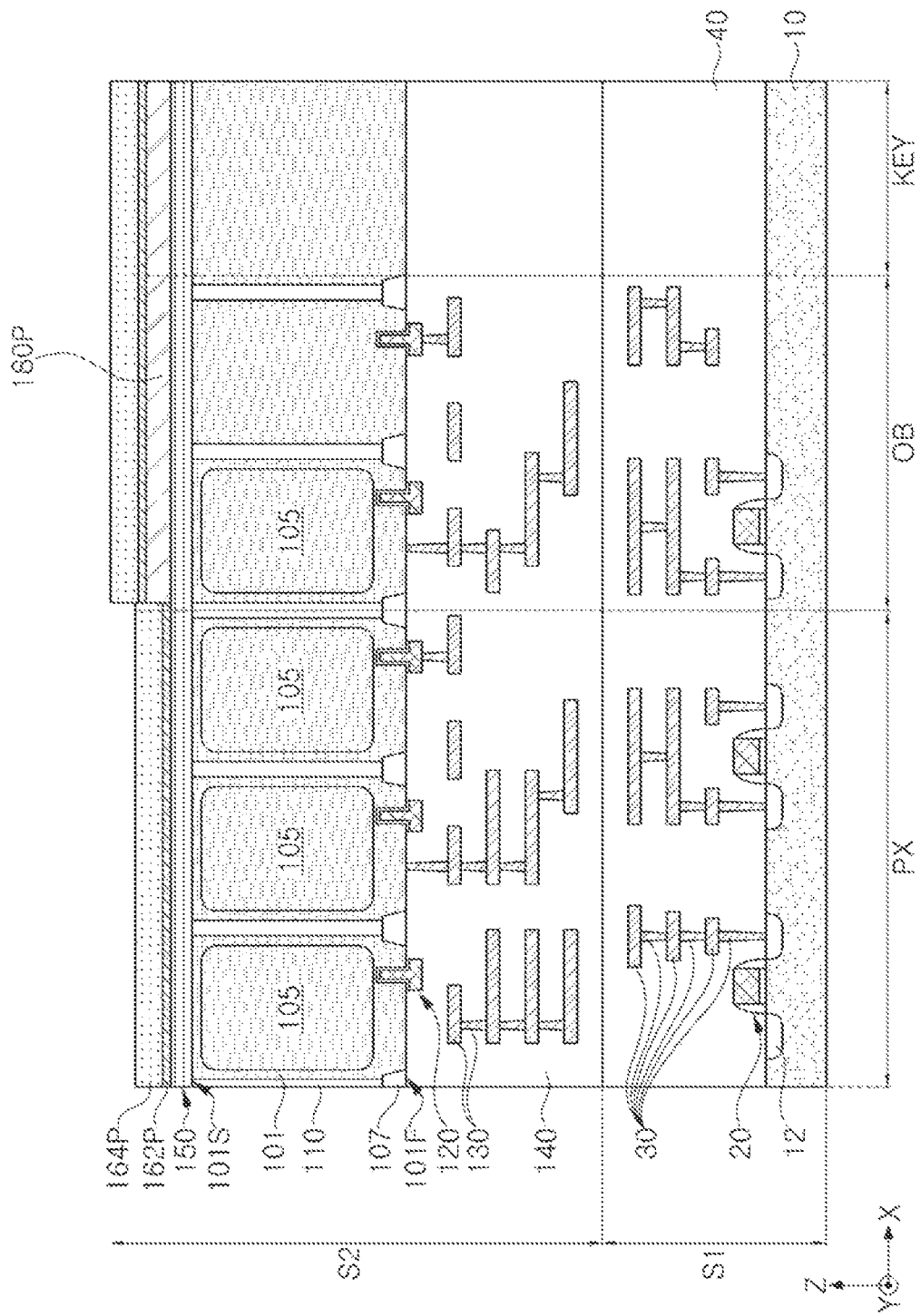

Referring to FIG. 8E, first and second preliminary grid layers 162P and 164P may be formed.

The first and second preliminary grid layers 162P and 164P may be layers for forming the first and second grid layers 162 and 164 of the grid layer 160 through subsequent patterning. In the pixel area PX, the first and second preliminary grid layers 162P and 164P may be formed to contact the upper surface of the third insulating layer 150, and the first and second preliminary grid layers 162P and 164P may be formed to contact the upper surface of the preliminary conductive layer 180P in the alignment key area KEY.

Figure 8F:
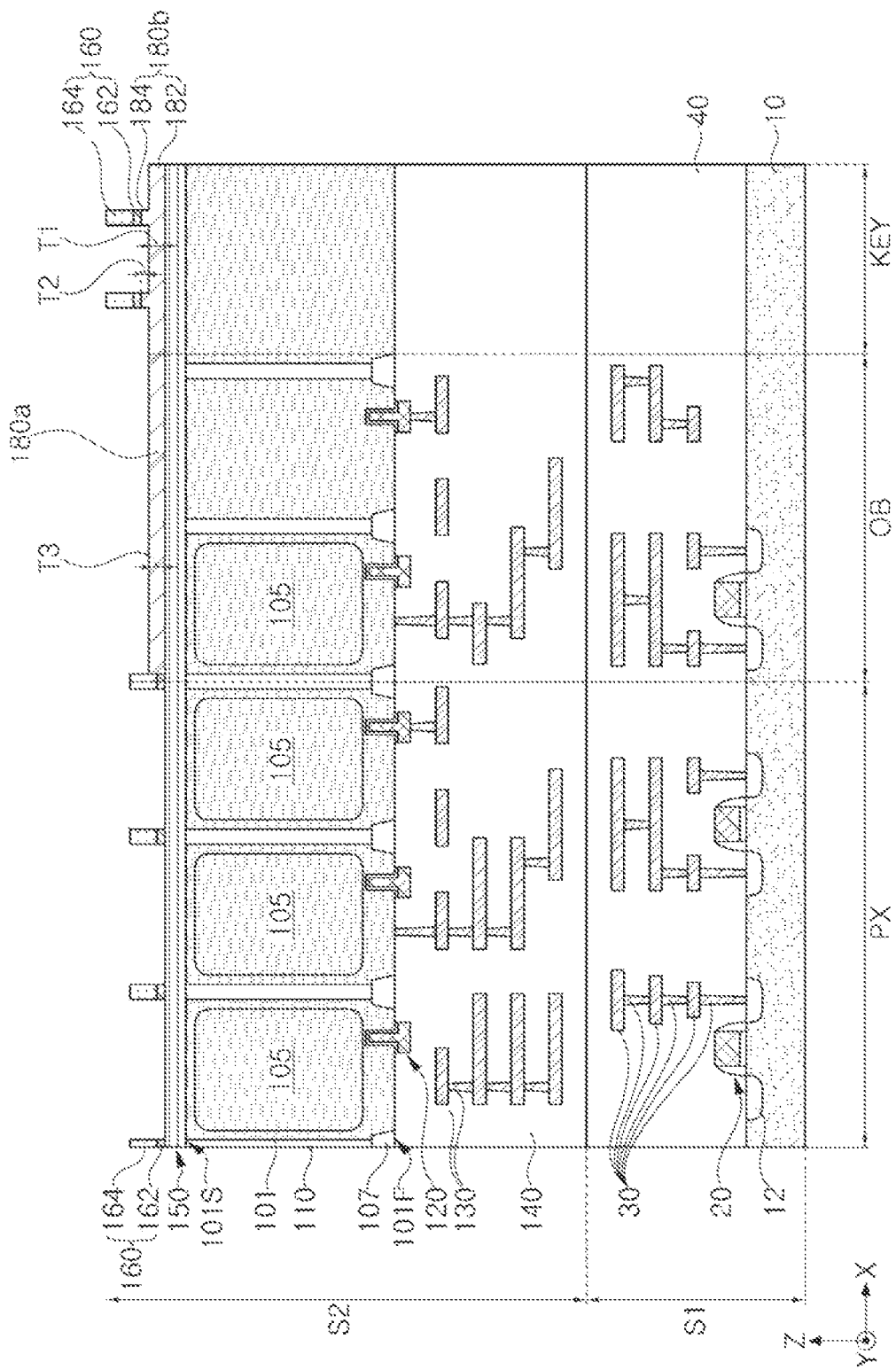

Referring to FIG. 8F, a grid layer 160 may be formed by patterning the first and second preliminary grid layers 162P and 164P.

In the pixel area PX, the first and second preliminary grid layers 162P and 164P have etch selectivity with respect to the third insulating layer 150 and are partially removed to form the grid layer 160.

In the optical black area OB and the alignment key area KEY, the preliminary conductive layer 180P together with portions of the first and second preliminary grid layers 162P and 164P may be removed from the upper surface by a predetermined thickness. Accordingly, in the optical black area OB, the light-shielding conductive layer 180a having a third thickness T3 that is reduced from the thickness T5 of the preliminary conductive layer 180P (see FIG. 8D) may be formed. In the alignment key area KEY, the key pattern layer 180b including the first region 182 having a first thickness T1 substantially equal to the third thickness T3, and a second region 184 having side surfaces substantially coplanar with the grid layer 160, protruding from the first region 182, and having a second thickness T2, may be formed.

Next, referring to FIGS. 2A and 2B together, color filters 170 and microlenses 190 may be formed on the grid layer 160. In an area other than the pixel area PX, a light blocking color filter 175 and a capping layer 195 may be formed. In example embodiments, a portion of the color filters 170, and the light blocking color filter 175, may include the same material, and may be simultaneously formed, and the microlenses 190 and the capping layer 195 may be formed of the same material and may be formed simultaneously, but the configurations are not limited thereto.

As set forth above, according to an example embodiment, an image sensor having improved reliability may be provided by optimizing the structure of the key pattern layer in the alignment key area to improve alignment accuracy during a manufacturing process.

While example embodiments have been illustrated and described above, it will be apparent to those skilled in the art that modifications and variations could be made without departing from the scope as defined by the appended claims and their equivalents.

What is claimed is:

1. An image sensor comprising:
    a first chip structure including a first substrate, a first interconnection structure disposed on the first substrate, and a first insulating layer disposed on the first substrate to at least partially cover the first interconnection structure; and
    a second chip structure disposed on the first chip structure, the second chip structure including a pixel area including a plurality of unit pixels, an optical black area disposed outside of the pixel area, and an alignment key area disposed outside of the pixel area,
    wherein the second chip structure further includes:
        a second substrate having a first surface facing the first chip structure and a second surface opposite to the first surface;
        a second interconnection structure and a second insulating layer disposed between the first surface of the second substrate and the first chip structure;

photoelectric conversion elements disposed in the second substrate disposed in the pixel area;
a third insulating layer disposed on the second surface of the second substrate;
a grid layer disposed on the third insulating layer disposed in the pixel area and the third insulating layer disposed in the alignment key area;
a key pattern layer disposed between the third insulating layer disposed in the alignment key area and the grid layer disposed in the alignment key area; and
color filters and microlenses disposed on the third insulating layer disposed in the pixel area and the grid layer disposed in the pixel area,
wherein the key pattern layer includes a first region disposed on the third insulating layer, and a second region protruding from the first region and disposed on a surface of the grid layer, an upper surface of the first region having a first height level and an upper surface of the second region having a second height level that is greater than the first height level.

2. The image sensor of claim 1, wherein an upper surface of the grid layer disposed in the pixel area has a first height level, and
wherein an upper surface of the grid layer disposed in the alignment key area has a second height level higher than the first height level.

3. The image sensor of claim 1, wherein a lower surface of the grid layer disposed in the pixel area directly contacts an upper surface of the third insulating layer disposed in the pixel area.

4. The image sensor of claim 1, wherein the key pattern layer includes a metal material, and the grid layer includes an insulating material.

5. The image sensor of claim 4, wherein the grid layer includes a metal barrier layer in a lower portion of the grid layer and an insulating layer disposed on an upper surface of the metal barrier layer.

6. The image sensor of claim 1, wherein the first region of the key pattern layer includes a material different from a material of the second region of the key pattern layer.

7. The image sensor of claim 1, wherein a thickness of the second region of the key pattern layer ranges from 100 Å to 1000 Å.

8. The image sensor of claim 1, wherein the second chip structure further includes a light-shielding conductive layer disposed on the third insulating layer in the optical black area,
wherein the light-shielding conductive layer and the key pattern layer include the same material.

9. The image sensor of claim 8, wherein a thickness of the light-shielding conductive layer is substantially the same as a thickness of the first region of the key pattern layer.

10. The image sensor of claim 1, wherein the alignment key area is disposed to be at least partially surrounded by the optical black area.

11. The image sensor of claim 1, wherein the second chip structure further includes a pad area disposed outside of the optical black area, the pad area including input/output pads, and
wherein the pad area includes a connection via including the same material as a material of the key pattern layer, the connection via extending from the second surface of the second substrate to the first chip structure.

12. An image sensor comprising:
a substrate, in which a pixel area including a plurality of unit pixels, an optical black area located outside of the pixel area, and an alignment key area located outside of the pixel area are included, the substrate having a first surface and a second surface opposing the first surface;
an interconnection structure disposed on the first surface of the substrate;
photoelectric conversion elements disposed in the pixel area of the substrate;
an insulating layer disposed on the second surface of the substrate;
a grid layer disposed on the insulating layer disposed in the pixel area and the insulating layer disposed in the alignment key area;
a key pattern layer disposed between the insulating layer disposed in the alignment key area and the grid layer disposed in the alignment key area, the key pattern layer including a protruding region protruding from a first region of the key pattern layer and disposed on a surface of the grid layer, an upper surface of the first region having a first height level and an upper surface of the protruding region having a second height level that is greater than the first height level; and
color filters disposed on the insulating layer disposed in the pixel area and the grid layer disposed in the pixel area.

13. The image sensor of claim 12, wherein in the pixel area, a lower surface of the grid layer is in contact with the insulating layer, and
wherein a lower surface of the grid layer disposed in the alignment key area is in contact with the key pattern layer disposed in the alignment key area.

14. The image sensor of claim 12, wherein a height level of the grid layer disposed in the alignment key area is higher than a height level of the grid layer disposed in the pixel area.

15. The image sensor of claim 12, further comprising a light-shielding conductive layer disposed on the insulating layer in the optical black area,
wherein the light-shielding conductive layer and the key pattern layer are connected to each other.

16. An image sensor comprising:
a substrate including a pixel area that includes a plurality of unit pixels and an alignment key area disposed outside of the pixel area;
photoelectric conversion elements disposed in the pixel area of the substrate;
an insulating layer disposed on a surface of the substrate;
a grid layer disposed on the insulating layer;
a key pattern layer disposed between the insulating layer disposed in the alignment key area and the grid layer disposed in the alignment key area, the key pattern layer including regions having different thicknesses, the regions comprising a protruding region disposed on a surface of the grid layer; and
color filters disposed on the insulating layer disposed in the pixel area and the grid layer disposed in the pixel area.

17. The image sensor of claim 16, wherein the key pattern layer includes a first region disposed on the insulating layer, and the protruding region disposed on the first region and protruding from the first region and disposed on the grid layer, an upper surface of the first region having a first height level and an upper surface of the second region having a second height level that is greater than the first height level.

18. The image sensor of claim 17, wherein a side surface of the protruding region of the key pattern layer is coplanar with a side surface of the grid layer.

19. The image sensor of claim 16, wherein the substrate further includes an optical black area disposed outside of the pixel area, and wherein the key pattern layer extends onto the insulating layer disposed in the optical black area to form a light-shielding conductive layer.

20. The image sensor of claim 19, wherein a maximum thickness of the key pattern layer is greater than a maximum thickness of the light-shielding conductive layer.

* * * * *